United States Patent
Pesach et al.

(10) Patent No.: US 9,030,528 B2
(45) Date of Patent: May 12, 2015

(54) MULTI-ZONE IMAGING SENSOR AND LENS ARRAY

(75) Inventors: Benny Pesach, Rosh Ha'ayin (IL); Erez Sali, Savyon (IL); Alexander Shpunt, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 452 days.

(21) Appl. No.: 13/437,977

(22) Filed: Apr. 3, 2012

(65) Prior Publication Data

US 2012/0249744 A1    Oct. 4, 2012

Related U.S. Application Data

(60) Provisional application No. 61/471,215, filed on Apr. 4, 2011.

(51) Int. Cl.
| | | |
|---|---|---|
| *H04N 13/02* | (2006.01) | |
| *H04N 9/04* | (2006.01) | |
| *H01L 27/146* | (2006.01) | |
| *H04N 5/33* | (2006.01) | |
| *H04N 5/335* | (2011.01) | |

(52) U.S. Cl.
CPC .......... *H04N 9/045* (2013.01); *H01L 27/14621* (2013.01); *H01L 27/14625* (2013.01); *H01L 27/14685* (2013.01); *H04N 5/332* (2013.01)

(58) Field of Classification Search
CPC .......... H04N 13/0239; H04N 13/0055; H04N 13/0296; H04N 13/0497; H04N 13/0242
USPC .......................................................... 348/46
See application file for complete search history.

(56) References Cited

U.S. PATENT DOCUMENTS

| | | |
|---|---|---|
| 4,336,978 A | 6/1982 | Suzuki |
| 4,542,376 A | 9/1985 | Bass et al. |
| 4,802,759 A | 2/1989 | Matsumoto |
| 4,843,568 A | 6/1989 | Krueger et al. |
| 5,075,562 A | 12/1991 | Greivenkamp et al. |
| 5,483,261 A | 1/1996 | Yasutake |
| 5,630,043 A | 5/1997 | Uhlin |
| 5,636,025 A | 6/1997 | Bieman et al. |
| 5,712,682 A | 1/1998 | Hannah |
| 5,835,218 A | 11/1998 | Harding |

(Continued)

FOREIGN PATENT DOCUMENTS

| | | |
|---|---|---|
| DE | 19736169 A1 | 8/1997 |
| DE | 19638727 A1 | 3/1998 |

(Continued)

OTHER PUBLICATIONS

Japanese Patent Application # 2011-517308 Official Action dated Dec. 5, 2012.

(Continued)

*Primary Examiner* — Sath V Perungavoor
*Assistant Examiner* — Howard D Brown, Jr.
(74) *Attorney, Agent, or Firm* — D. Kligler I.P. Services Ltd.

(57) ABSTRACT

An imaging module includes a matrix of detector elements formed on a single semiconductor substrate and configured to output electrical signals in response to optical radiation that is incident on the detector elements. A filter layer is disposed over the detector elements and includes multiple filter zones overlying different, respective, convex regions of the matrix and having different, respective passbands.

26 Claims, 3 Drawing Sheets

(56) References Cited

U.S. PATENT DOCUMENTS

| | | |
|---|---|---|
| 5,838,428 A | 11/1998 | Pipitone et al. |
| 5,856,871 A | 1/1999 | Cabib et al. |
| 5,909,312 A | 6/1999 | Mendlovic et al. |
| 6,041,140 A | 3/2000 | Binns et al. |
| 6,081,269 A | 6/2000 | Quarendon |
| 6,084,712 A | 7/2000 | Harding |
| 6,088,105 A | 7/2000 | Link |
| 6,099,134 A | 8/2000 | Taniguchi et al. |
| 6,100,517 A | 8/2000 | Yahav et al. |
| 6,101,269 A | 8/2000 | Hunter et al. |
| 6,108,036 A | 8/2000 | Harada et al. |
| 6,167,151 A | 12/2000 | Albeck |
| 6,259,561 B1 | 7/2001 | George et al. |
| 6,262,740 B1 | 7/2001 | Lauer et al. |
| 6,268,923 B1 | 7/2001 | Michniewicz et al. |
| 6,301,059 B1 | 10/2001 | Huang et al. |
| 6,377,700 B1 | 4/2002 | Mack et al. |
| 6,438,263 B2 | 8/2002 | Albeck et al. |
| 6,494,837 B2 | 12/2002 | Kim et al. |
| 6,495,813 B1* | 12/2002 | Fan et al. ............ 250/208.1 |
| 6,495,848 B1 | 12/2002 | Rubbert |
| 6,650,357 B1* | 11/2003 | Richardson ............ 348/80 |
| 6,686,921 B1 | 2/2004 | Rushmeier et al. |
| 6,700,669 B1 | 3/2004 | Geng |
| 6,731,391 B1 | 5/2004 | Kao et al. |
| 6,741,251 B2 | 5/2004 | Malzbender |
| 6,750,906 B1 | 6/2004 | Itani et al. |
| 6,751,344 B1 | 6/2004 | Grumbine |
| 6,754,370 B1 | 6/2004 | Hall-Holt et al. |
| 6,759,646 B1 | 7/2004 | Acharya et al. |
| 6,765,617 B1* | 7/2004 | Tangen et al. ............ 348/340 |
| 6,803,777 B2 | 10/2004 | Pfaff et al. |
| 6,810,135 B1 | 10/2004 | Berenz et al. |
| 6,813,440 B1 | 11/2004 | Yu et al. |
| 6,825,985 B2 | 11/2004 | Brown et al. |
| 6,841,780 B2 | 1/2005 | Cofer et al. |
| 6,859,326 B2 | 2/2005 | Sales |
| 6,937,348 B2 | 8/2005 | Geng |
| 7,006,952 B1 | 2/2006 | Matsumoto et al. |
| 7,009,742 B2 | 3/2006 | Brotherton-Ratcliffe et al. |
| 7,013,040 B2 | 3/2006 | Shiratani |
| 7,076,024 B2 | 7/2006 | Yokhin |
| 7,112,774 B2 | 9/2006 | Baer |
| 7,120,228 B2 | 10/2006 | Yokhin et al. |
| 7,127,101 B2 | 10/2006 | Littlefield et al. |
| 7,194,105 B2 | 3/2007 | Hersch et al. |
| 7,231,069 B2 | 6/2007 | Nahata |
| 7,256,899 B1 | 8/2007 | Faul et al. |
| 7,335,898 B2 | 2/2008 | Donders et al. |
| 7,369,685 B2 | 5/2008 | DeLean |
| 7,385,708 B2 | 6/2008 | Ackerman et al. |
| 7,433,024 B2 | 10/2008 | Garcia et al. |
| 7,551,719 B2 | 6/2009 | Yokhin et al. |
| 7,560,679 B1 | 7/2009 | Gutierrez |
| 7,659,995 B2 | 2/2010 | Knighton et al. |
| 7,700,904 B2 | 4/2010 | Toyoda et al. |
| 7,751,063 B2 | 7/2010 | Dillon et al. |
| 7,811,825 B2 | 10/2010 | Fauver et al. |
| 7,840,031 B2 | 11/2010 | Albertson et al. |
| 7,952,781 B2 | 5/2011 | Weiss et al. |
| 8,018,579 B1 | 9/2011 | Krah |
| 8,035,806 B2 | 10/2011 | Jin et al. |
| 8,126,261 B2 | 2/2012 | Medioni et al. |
| 8,326,025 B2 | 12/2012 | Boughorbel |
| 2001/0016063 A1 | 8/2001 | Albeck et al. |
| 2002/0041327 A1 | 4/2002 | Hildreth et al. |
| 2002/0075456 A1 | 6/2002 | Shiratani |
| 2002/0154215 A1* | 10/2002 | Schechterman et al. ......... 348/51 |
| 2002/0154315 A1* | 10/2002 | Myrick ............ 356/451 |
| 2003/0038938 A1* | 2/2003 | Jung et al. ............ 356/419 |
| 2003/0048237 A1 | 3/2003 | Sato et al. |
| 2003/0057972 A1 | 3/2003 | Pfaff et al. |
| 2003/0156756 A1 | 8/2003 | Gokturk et al. |
| 2004/0001145 A1 | 1/2004 | Abbate |
| 2004/0063235 A1 | 4/2004 | Chang |
| 2004/0105580 A1 | 6/2004 | Hager et al. |
| 2004/0130730 A1 | 7/2004 | Cantin et al. |
| 2004/0130790 A1 | 7/2004 | Sales |
| 2004/0174770 A1 | 9/2004 | Rees |
| 2004/0186382 A1* | 9/2004 | Modell et al. ............ 600/473 |
| 2004/0213463 A1 | 10/2004 | Morrison |
| 2004/0218262 A1 | 11/2004 | Chuang et al. |
| 2004/0228519 A1 | 11/2004 | Littlefield et al. |
| 2004/0264764 A1 | 12/2004 | Kochi et al. |
| 2005/0018209 A1 | 1/2005 | Lemelin et al. |
| 2005/0024520 A1* | 2/2005 | Yamamoto ............ 348/340 |
| 2005/0052637 A1 | 3/2005 | Shaw et al. |
| 2005/0062863 A1* | 3/2005 | Takeuchi et al. ............ 348/272 |
| 2005/0111705 A1 | 5/2005 | Waupotitsch et al. |
| 2005/0134582 A1 | 6/2005 | Claus et al. |
| 2005/0135555 A1 | 6/2005 | Claus et al. |
| 2005/0200838 A1 | 9/2005 | Shaw et al. |
| 2005/0200925 A1 | 9/2005 | Brotherton-Ratcliffe et al. |
| 2005/0231465 A1 | 10/2005 | DePue et al. |
| 2005/0271279 A1 | 12/2005 | Fujimura et al. |
| 2006/0017656 A1 | 1/2006 | Miyahara |
| 2006/0039010 A1* | 2/2006 | Reese et al. ............ 356/601 |
| 2006/0054782 A1* | 3/2006 | Olsen et al. ............ 250/208.1 |
| 2006/0066922 A1* | 3/2006 | Nishi ............ 358/482 |
| 2006/0072851 A1 | 4/2006 | Kang et al. |
| 2006/0156756 A1 | 7/2006 | Becke |
| 2006/0221218 A1 | 10/2006 | Adler et al. |
| 2006/0221250 A1 | 10/2006 | Rossbach et al. |
| 2006/0269896 A1 | 11/2006 | Liu et al. |
| 2007/0057946 A1 | 3/2007 | Albeck et al. |
| 2007/0060336 A1 | 3/2007 | Marks et al. |
| 2007/0133840 A1 | 6/2007 | Cilia |
| 2007/0165243 A1 | 7/2007 | Kang et al. |
| 2007/0262985 A1 | 11/2007 | Watanable et al. |
| 2008/0018595 A1 | 1/2008 | Hildreth et al. |
| 2008/0031513 A1 | 2/2008 | Hart |
| 2008/0037829 A1 | 2/2008 | Givon |
| 2008/0106746 A1 | 5/2008 | Shpunt et al. |
| 2008/0118143 A1 | 5/2008 | Gordon et al. |
| 2008/0158344 A1* | 7/2008 | Schechterman et al. ......... 348/46 |
| 2008/0198355 A1 | 8/2008 | Domenicali et al. |
| 2008/0212835 A1 | 9/2008 | Tavor |
| 2008/0240502 A1 | 10/2008 | Freedman et al. |
| 2008/0247670 A1 | 10/2008 | Tam et al. |
| 2008/0278572 A1 | 11/2008 | Gharib et al. |
| 2008/0285827 A1 | 11/2008 | Meyer et al. |
| 2009/0016642 A1 | 1/2009 | Hart |
| 2009/0046152 A1 | 2/2009 | Aman |
| 2009/0060307 A1 | 3/2009 | Ghanem et al. |
| 2009/0096783 A1 | 4/2009 | Shpunt et al. |
| 2009/0183125 A1 | 7/2009 | Magal et al. |
| 2009/0183152 A1 | 7/2009 | Yang et al. |
| 2009/0185274 A1 | 7/2009 | Shpunt |
| 2009/0225217 A1* | 9/2009 | Katsuda et al. ............ 348/366 |
| 2009/0226079 A1 | 9/2009 | Katz et al. |
| 2009/0244309 A1 | 10/2009 | Maison et al. |
| 2010/0007717 A1 | 1/2010 | Spektor et al. |
| 2010/0013860 A1 | 1/2010 | Mandella et al. |
| 2010/0020078 A1 | 1/2010 | Shpunt |
| 2010/0033611 A1* | 2/2010 | Lee et al. ............ 348/302 |
| 2010/0059844 A1* | 3/2010 | Tanaka ............ 257/432 |
| 2010/0118123 A1 | 5/2010 | Freedman et al. |
| 2010/0128221 A1 | 5/2010 | Muller et al. |
| 2010/0142014 A1 | 6/2010 | Rosen et al. |
| 2010/0177164 A1 | 7/2010 | Zalevsky et al. |
| 2010/0182406 A1 | 7/2010 | Benitez |
| 2010/0194745 A1 | 8/2010 | Leister et al. |
| 2010/0201811 A1 | 8/2010 | Garcia et al. |
| 2010/0225746 A1 | 9/2010 | Shpunt et al. |
| 2010/0243899 A1 | 9/2010 | Ovsiannikov et al. |
| 2010/0245826 A1 | 9/2010 | Lee |
| 2010/0265316 A1 | 10/2010 | Sali et al. |
| 2010/0278384 A1 | 11/2010 | Shotton et al. |
| 2010/0283842 A1* | 11/2010 | Guissin et al. ............ 348/68 |
| 2010/0284082 A1 | 11/2010 | Shpunt et al. |
| 2010/0290698 A1 | 11/2010 | Shpunt et al. |
| 2010/0303289 A1 | 12/2010 | Polzin et al. |
| 2011/0001799 A1 | 1/2011 | Rothenberger et al. |
| 2011/0025827 A1 | 2/2011 | Shpunt et al. |

(56) References Cited

U.S. PATENT DOCUMENTS

| | | | |
|---|---|---|---|
| 2011/0043403 A1 | 2/2011 | Loffler | |
| 2011/0069189 A1* | 3/2011 | Venkataraman et al. | 348/218.1 |
| 2011/0074932 A1 | 3/2011 | Gharib et al. | |
| 2011/0096182 A1 | 4/2011 | Cohen et al. | |
| 2011/0134114 A1 | 6/2011 | Rais et al. | |
| 2011/0158508 A1 | 6/2011 | Shpunt et al. | |
| 2011/0187878 A1 | 8/2011 | Mor et al. | |
| 2011/0188054 A1* | 8/2011 | Petronius et al. | 356/610 |
| 2011/0211044 A1 | 9/2011 | Shpunt et al. | |
| 2011/0241549 A1* | 10/2011 | Wootton | 315/117 |
| 2011/0279648 A1 | 11/2011 | Lutian et al. | |
| 2011/0285910 A1 | 11/2011 | Bamji et al. | |
| 2011/0310125 A1 | 12/2011 | McEldowney et al. | |
| 2012/0012899 A1 | 1/2012 | Jin et al. | |
| 2012/0051588 A1 | 3/2012 | McEldowney | |
| 2012/0098972 A1* | 4/2012 | Hansen et al. | 348/164 |
| 2012/0140109 A1* | 6/2012 | Shpunt et al. | 348/345 |
| 2014/0118493 A1* | 5/2014 | Sali et al. | 348/43 |

FOREIGN PATENT DOCUMENTS

| | | | |
|---|---|---|---|
| GB | 2352901 | A | 2/2001 |
| JP | 62206684 | A | 9/1987 |
| JP | 01-240863 | | 9/1989 |
| JP | 03-029806 | U | 2/1991 |
| JP | H03-040591 | A | 2/1991 |
| JP | 06-273432 | | 9/1994 |
| JP | H08-186845 | A | 7/1996 |
| JP | H10-327433 | A | 12/1998 |
| JP | 2000131040 | A | 5/2000 |
| JP | 2001141430 | A | 5/2001 |
| JP | 2002122417 | A | 4/2002 |
| JP | 2002-152776 | A | 5/2002 |
| JP | 2002-213931 | A | 7/2002 |
| JP | 2002-365023 | A | 12/2002 |
| JP | 2006-128818 | A | 5/2006 |
| WO | 9303579 | A1 | 2/1993 |
| WO | 9827514 | A2 | 6/1998 |
| WO | 9828593 | A1 | 7/1998 |
| WO | 9828593 | A2 | 7/1998 |
| WO | 2005010825 | A2 | 2/2005 |

OTHER PUBLICATIONS

U.S. Appl. No. 12/844,864 Official Action dated Dec. 6, 2012.
U.S. Appl. No. 12/758,047 Official Action dated Oct. 25, 2012.
U.S. Appl. No. 13/036,023 Official Action dated Jan. 7, 2013.
Korean Patent Application # 10-2008-7025030 Office Action dated Feb. 25, 2013.
U.S. Appl. No. 12/707,678 Office Action dated Feb. 26, 2013.
U.S. Appl. No. 12/758,047 Office Action dated Apr. 25, 2013.
U.S. Appl. No. 12/844,864 Office Action dated Apr. 11, 2013.
Japanese Patent Application # 2011-517308 Office Action dated Jun. 19, 2013.
U.S. Appl. No. 13/036,023 Office Action dated Jul. 17, 2013.
U.S. Appl. No. 12/707,678 Office Action dated Jun. 20, 2013.
International Application PCT/IB2013/051189 Search Report dated Jun. 18, 2013.
U.S. Appl. No. 13/036,023 Office Action dated Sep. 3, 2013.
Japanese Patent Application # 2008558981 Official Action dated Nov. 2, 2011.
U.S. Appl. No. 12/522,171 Official Action dated Dec. 22, 2011.
U.S. Appl. No. 12/522,172 Official Action dated Nov. 30, 2011.
Japanese Patent Application # 2008558984 Official Action dated Nov. 1, 2011.
U.S. Appl. No. 13/043,488 Official Action dated Jan. 3, 2012.
Japanese Patent Application # 2008535179 Official Action dated Nov. 8, 2011.
Chinese Patent Application # 2006800038004.2 Official Action dated Nov. 24, 2011.
Marcia et al., "Superimposed Video Disambiguation for Increased Field of View", Optics Express 16:21, pp. 16352-16363, year 2008.
Guan et al., "Composite Structured Light Pattern for Three Dimensional Video", Optics Express 11:5, pp. 406-417, year 2008.
Hart, D., U.S. Appl. No. 09/616,606 "Method and System for High Resolution , Ultra Fast 3-D Imaging" filed on Jul. 14, 2000.
International Application PCT/IL2007/000306 Search Report dated Oct. 2, 2008.
International Application PCT/IL20027/000262 Search Report dated Oct. 16, 2008.
International Application PCT/IL2008/000458 Search Report dated Oct. 28, 2008.
International Application PCT/IL2008/000327 Search Report dated Sep. 26, 2008.
International Application PCT/IL2006/000335 Preliminary Report on Patentability dated Apr. 24, 2008.
Sazbon et al., "Qualitative real-time range extraction for preplanned scene partitioning using laser beam coding", Pattern Recognition Letters 26, pp. 1772-1781, year 2005.
Sjodahl et al., "Measurement of shape by using projected random and patterns and temporal digital speckle photography", Applied Optics, vol. 38, No. 10, Apr. 1, 1999.
Garcia et al., "Three dimensional mapping and range measurement by means of projected speckle patterns", Applied Optics, vol. 47, No. 16, Jun. 1, 2008.
Chen et al., "Measuring of a Three-Dimensional Surface by Use of a Spatial Distance Computation", Applied Optics, vol. 42, issue 11, pp. 1958-1972, Apr. 10, 2003.
Ypsilos et al., "Speech-driven Face Synthesis from 3D Video", 2nd International Symposium on 3D Processing, Visualization and Transmission, Thessaloniki, Greece, Sep. 6-9, 2004.
Hanson et al., "Optics and Fluid Dynamics Department", Annual Progress Report for 1997 (an abstract).
Ypsilos et al., "Video-rate capture of Dynamic Face Shape and Appearance", Sixth IEEE International Conference on Automatic Face and Gesture Recognition (FGR 2004), Seoul, Korea, May 17-19, 2004.
Goodman, J.W., "Statistical Properties of Laser Speckle Patterns", Laser Speckle and Related Phenomena, pp. 9-75, Springer-Verlag, Berlin Heidelberg, 1975.
Dainty, J.C., "Introduction", Laser Speckle and Related Phenomena, pp. 1-7, Springer-Verlag, Berlin Heidelberg, 1975.
Avidan et al., "Trajectory triangulation: 3D reconstruction of moving points from amonocular image sequence", IEEE Transactions on Pattern Analysis and Machine Intelligence, vol. 22, No. 4, pages, Apr. 2000.
Leclerc et al., "The direct computation of height from shading", Proceedings of Computer Vision and Pattern Recognition, pp. 552-558, year 1991.
Zhang et al., "Height recovery from intensity gradients", Proceedings of IEEE Computer Society Conference on Computer Vision and Pattern Recognition, pp. 508-513, year 1994.
Zigelman et al., "Texture mapping using surface flattening via multidimensional scaling", IEEE Transactions on Visualization and Computer Graphics, 8 (2), pp. 198-207, year 2002.
Kimmel et al., "Analyzing and synthesizing images by evolving curves with the Osher-Sethian method", International Journal of Computer Vision, 24(1), pp. 37-56 , year 1997.
Koninckx et al., "Efficient, Active 3D Acquisition, based on a Pattern-Specific Snake", Luc Van Gool (Editor), (DAGM 2002) Pattern Recognition, Lecture Notes in Computer Science 2449, pp. 557-565, Springer 2002.
Horn, B., "Height and gradient from shading", International Journal of Computer Vision, No. 5, pp. 37-76, year 1990.
Bruckstein, A., "On shape from shading", Computer Vision, Graphics, and Image Processing, vol. 44, pp. 139-154, year 1988.
Zhang et al., "Rapid Shape Acquisition Using Color Structured Light and Multi-Pass Dynamic Programming", 1st International Symposium on 3D Data Processing Visualization and Transmission (3DPVT), Padova, Italy, Jul. 2002.
Besl, P., "Active Optical Range Imaging Sensors", Machine Vision and Applications, No. 1, pp. 127-152, USA 1988.
Horn et al., "Toward optimal structured light patterns", Proceedings of International Conference on Recent Advances in 3D Digital Imaging and Modeling, pp. 28-37, Ottawa, Canada, May 1997.

(56) References Cited

OTHER PUBLICATIONS

Mendlovic, et al., "Composite harmonic filters for scale, projection and shift invariant pattern recognition", Applied Optics, vol. 34, No. 2, pp. 310-316, Jan. 10, 1995.
Asada et al., "Determining Surface Orientation by Projecting a Stripe Pattern", IEEE Transactions on Pattern Analysis and Machine Intelligence, vol. 10, No. 5, year 1988.
Winkelbach et al., "Shape from Single Stripe Pattern Illumination", Luc Van Gool (Editor), (DAGM 2002) Patter Recognition, Lecture Notes in Computer Science 2449, p. 240-247, Springer 2002.
EZconn Czech A.S., "Site Presentation", Oct. 2009.
Zhu et al., "Fusion of Time-of-Flight Depth and Stereo for High Accuracy Depth Maps", Proceedings of the IEEE Conference on Computer Vision and Pattern Recognition, Anchorage, USA, Jun. 24-26, 2008.
Luxtera Inc., "Luxtera Announces World's First 10GBit CMOS Photonics Platform", Carlsbad, USA, Mar. 28, 2005 (press release).
Lee et al., "Variable Pulse Mode Driving IR Source Based 3D Robotic Camera", MVA2005 IAPR Conference on Machine Vision Applications, pp. 530-533, Japan, May 16-18, 2005.
Mordohai et al., "Tensor Voting: A Perceptual Organization Approach to Computer Vision and Machine Learning", Synthesis Lectures on Image, Video and Multimedia Processing, issue No. 8, Publishers Morgan and Claypool, year 2006.
Beraldin et al., "Active 3D Sensing", Scuola Normale Superiore Pisa, vol. 10, pp. 22-46, Apr. 2000.
Bhat et al., "Ordinal Measures for Image Correspondence", IEEE Transactions on Pattern Analysis and Machine Intelligence, vol. 20, No. 4, pp. 415-423, Apr. 1998.
Bradley et al., "Synchronization and Rolling Shutter Compensation for Consumer Video Camera Arrays", IEEE International Workshop on Projector-Camera Systems—PROCAMS 2009 (Miami Beach, Florida, 2009).
De Piero et al., "3D Computer Vision Using Structured Light: Design Calibration and Implementation Issues", Advances in Computers, vol. 43, pp. 243-278, Academic Press 1996.
Hongjun et al., "Shape Measurement by Digital Speckle Temporal Sequence Correlation Method", Acta Optica Sinica Journal, vol. 21, No. 10, pp. 1208-1213, Oct. 2001 (with English abstract).
Hongjun, D., "Digital Speckle Temporal Sequence Correlation Method and the Application in Three-Dimensional Shape Measurement", Chinese Doctoral Dissertations & Master's Theses, Full-text Database (Master) Basic Sciences, No. 1, Mar. 15, 2004.
Hsueh et al., "Real-time 3D Topography by Speckle Image Correlation", Proceedings of SPIE Conference on Input/Output and Imaging Technologies, vol. 3422, pp. 108-112, Taiwan, Jul. 1998.
Chinese Patent Application # 200780009053.8 Official Action dated Apr. 15, 2010 (English translation).
Chinese Patent Application # 200680038004.2 Official Action dated Mar. 30, 2010 (English translation).
Chinese Patent Application # 200680038004.2 Official Action dated Aug. 3, 2011 (English translation).
Engfield, N., "Use of Pseudorandom Encoded Grid in U.S. Appl. No. 11/899,542", Andrews Robichaud, Jun. 22, 2011.
U.S. Appl. No. 61/471,215, filed Apr. 4, 2011.
U.S. Appl. No. 12/844,864 Office Action dated Sep. 26, 2013.
U.S. Appl. No. 13/921,224 Office Action dated Oct. 3, 2013.
U.S. Appl. No. 12/958,427 Office Action dated Nov. 22, 2013.
U.S. Appl. No. 12/522,171 Official Action dated Apr. 5, 2012.
U.S. Appl. No. 12/397,362 Official Action dated Apr. 24, 2012.
International Application PCT/IB2011/053560 Search Report dated Jan. 19, 2012.
International Application PCT/IB2011/055155 Search Report dated Apr. 20, 2012.
U.S. Appl. No. 13/311,589, filed Dec. 6, 2011.
U.S. Appl. No. 12/522,176 Official Action dated Aug. 2, 2012.
U.S. Appl. No. 61/598,921, filed Feb. 15, 2012.
Richardson, W. H., "Bayesian-Based Iterative Method of Image Restoration", Journal of the Optical Society of America, vol. 62, No. 1, pp. 55-59, Jan. 1972.
Omnivision Technologies Inc., "OV2710 1080p/720p HD Color CMOS Image Sensor with OmniPixel3-HS Technology", Dec. 2011.
U.S. Appl. No. 13/541,775, filed on Jul. 5, 2012.
U.S. Appl. No. 12/282,517 Official Action dated Jun. 12, 2012.
U.S. Appl. No. 12/522,172 Official Action dated Jun. 29, 2012.
U.S. Appl. No. 12/703,794 Official Action dated Aug. 7, 2012.
JP Patent Application # 2008558984 Office Action dated Jul. 3, 2012.
Abramson, N., "Holographic Contouring by Translation", Applied Optics Journal, vol. 15, No. 4, pp. 1018-1976, Apr. 1976.
Achan et al., "Phase Unwrapping by Minimizing Kikuchi Free Energy", IEEE International Geoscience and Remote Sensing Symposium, pp. 1738-1740, Toronto, Canada, Jun. 2002.
Theocaris et al., "Radial Gratings as Moire Gauges", Journal of Scientific Instruments (Journal of Physics E), series 2, vol. 1, year 1968.
International Application PCT/IB2011/053560 "Scanning Projectors and Image Capture Modules for 3D Mapping" filed on Aug. 10, 2011.
International Application PCT/IL2009/000285 Search Report dated Jun. 11, 2009.
Brooks et al., "Moire Gauging Using Optical Interference Patterns", Applied Optics Journal, vol. 8, No. 5, pp. 935-940, May 1969.
Hovanesian et al., "Moire Contour-Sum Contour-Difference, and Vibration Analysis of Arbitrary Objects", Applied Optics Journal, vol. 10, No. 12, pp. 2734-2738, Dec. 1971.
Bryngdahl, O., "Characteristics of Superposed Patterns in Optics", Journal of Optical Society of America, vol. 66, No. 2, pp. 87-94, Feb. 1976.
International Application PCT/IL2008/000095 Search Report dated Jul. 24, 2008.
Chen et al., "Overview of Three-Dimensional Shape Measurement Using Optical Methods", Society of Photo-Optical Instrumentation Engineers Journal 39(1), pp. 10-22, Jan. 2000.
Cohen et al., "High-Resolution X-ray Diffraction for Characterization and Monitoring of Silicon-On-Insulator Fabrication Processes", Applied Physics Journal, vol. 93, No. 1, pp. 245-250, Jan. 2003.
Zhang et al., "Shape from intensity gradient", IEEE Transactions on Systems, Man and Cybernetics—Part A: Systems and Humans, vol. 29, No. 3, pp. 318-325, May 1999.
Doty, J.L., "Projection Moire for Remote Contour Analysis", Journal of Optical Society of America, vol. 73, No. 3, pp. 366-372, Mar. 1983.
Ben Eliezer et al., "Experimental Realization of an Imaging System with an Extended Depth of Field", Applied Optics Journal, vol. 44, No. 14, pp. 2792-2798, May 10, 2005.
Tay et al., "Grating Projection System for Surface Contour Measurement", Applied Optics Journal, vol. 44, No. 8, pp. 1393-1400, Mar. 10, 2005.
Takeda et al., "Fourier Transform Methods of Fringe-Pattern Analysis for Computer-Based Topography and Interferometry", Journal of Optical Society of America, vol. 72, No. 1, Jan. 1982.
Takasaki, H., "Moire Topography", Applied Optics Journal, vol. 12, No. 4, pp. 845-850, Apr. 1973.
Takasaki, H., "Moire Topography", Applied Optics Journal, vol. 9, No. 6, pp. 1467-1472, Jun. 1970.
Hildebrand et al., "Multiple-Wavelength and Multiple-Source Holography Applied to Contour Generation", Journal of Optical Society of America Journal, vol. 57, No. 2, pp. 155-162, Feb. 1967.
Su et al., "Application of Modulation Measurement Profilometry to Objects with Surface Holes", Applied Optics Journal, vol. 38, No. 7, pp. 1153-1158, Mar. 1, 1999.
Btendo, "Two Uni-axial Scanning Mirrors Vs One Bi-axial Scanning Mirror", Kfar Saba, Israel, Aug. 13, 2008.
Hung et al., "Time-Averaged Shadow-Moire Method for Studying Vibrations", Applied Optics Journal, vol. 16, No. 6, pp. 1717-1719, Jun. 1977.
Idesawa et al., "Scanning Moire Method and Automatic Measurement of 3-D Shapes", Applied Optics Journal, vol. 16, No. 8, pp. 2152-2162, Aug. 1977.
Iizuka, K., "Divergence-Ratio Axi-Vision Camera (Divcam): A Distance Mapping Camera", Review of Scientific Instruments 77, 0451111 (2006).
Lim et al., "Additive Type Moire with Computer Image Processing", Applied Optics Journal, vol. 28, No. 13, pp. 2677-2680, Jul. 1, 1989.

(56) References Cited

OTHER PUBLICATIONS

Piestun et al., "Wave Fields in Three Dimensions: Analysis and Synthesis", Journal of the Optical Society of America, vol. 13, No. 9, pp. 1837-1848, Sep. 1996.

Post et al., "Moire Methods for Engineering and Science—Moire Interferometry and Shadow Moire", Photomechanics (Topics in Applied Physics), vol. 77, pp. 151-196, Springer Berlin / Heidelberg, Jan. 1, 2000.

Chinese Patent Application # 200780006560.6 Official Action dated Oct. 11, 2010.

International Application PCT/IB2010/053430 Search Report dated Dec. 28, 2010.

Scharstein et al., "High-Accuracy Stereo Depth Maps Using Structured Light", IEEE Proceedings of the Conference on Computer Vision and Pattern Recognition, pp. 165-171, Jun. 18, 2003.

Koschan et al., "Dense Depth Maps by Active Color Illumination and Image Pyramids", Advances in Computer Vision, pp. 137-148, Springer 1997.

Marcia et al., "Fast Disambiguation of Superimposed Images for Increased Field of View", IEEE International Conference on Image Processing, San Diego, USA, Oct. 12-15, 2008.

Microvision Inc., "Micro-Electro-Mechanical System (MEMS) Scanning Mirror", years 1996-2009.

U.S. Appl. No. 61/419,891 "Lens Arrays for Pattern Projection and Imaging" filed Dec. 6, 2010.

U.S. Appl. No. 61/415,352 "Depth mapping using time-coded illumination" filed Nov. 19, 2010.

Lavoie et al., "3-D Object Model Recovery From 2-D Images Using Structured Light", IEEE Transactions on Instrumentation and Measurement, vol. 53, No. 2, pp. 437-443, Apr. 2004.

Chinese Application # 200780016625.5 Office Action dated May 12, 2011.

U.S. Appl. No. 11/899,542 Office Action dated Apr. 4, 2011.

U.S. Appl. No. 11/724,068 Office Action dated Mar. 1, 2011.

Chinese Application # 200780009053.8 Office Action dated Mar. 10, 2011.

Japanese Application # 2008535179 Office Action dated Apr. 1, 2011.

Kun et al., "Gaussian Laser Beam Spatial Distribution Measurement by Speckles Displacement Method", HICH Power Laser and Particle Beams, vol. 12, No. 2, Apr. 2000.

Chinese Patent Application # 200680038004.2 Official Action dated Dec. 24, 2010.

Chinese Patent Application # 200780016625.5 Official Action dated Oct. 26, 2010.

Chinese Patent Application # 200780006560.6 Official Action dated Feb. 1, 2011.

Yao Kun et al., "Measurement of Space Distribution of Laser Gaussian Beam by Speckles Displacement Method", High Power Laser and Particle Beams, vol. 12, No. 2, pp. 141-144, Apr. 30, 2000.

\* cited by examiner

MULTI-ZONE IMAGING SENSOR AND LENS ARRAY

CROSS-REFERENCE TO RELATED APPLICATIONS

This application claims the benefit of U.S. Provisional Patent Application 61/471,215, filed Apr. 4, 2011, which is incorporated herein by reference.

FIELD OF THE INVENTION

The present invention relates generally to imaging systems, and particularly to devices and methods for multispectral imaging.

BACKGROUND

Many imaging applications involve capturing images simultaneously in multiple different spectral bands. For example, U.S. Patent Application Publication 2010/0007717, whose disclosure is incorporated herein by reference, describes an integrated processor for three-dimensional (3D) mapping. The device described includes a first input port for receiving color image data from a first image sensor and a second input port for receiving depth-related image data from a second image sensor. The second image sensor typically senses an image of a pattern of infrared radiation that is projected onto an object that is to be mapped. Processing circuitry generates a depth map using the depth-related image data and registers the depth map with the color image data. At least one output port conveys the depth map and the color image data to a host computer.

In some systems, a single image sensor is used to capture multiple images. For example, U.S. Pat. No. 7,231,069 describes a multiple-view-angle camera used in an automatic photographing apparatus, which includes a narrow view angle lens, a cylinder lens, and an image sensor. One image sensor is used, and a wide-view-angle image and a narrow-view-angle image are projected onto the image sensor at the same time.

As another example, U.S. Patent Application Publication 2004/0001145 describes a method and apparatus for multifield image generation and processing, in which a camera includes a plurality of lenses configurable in a plurality of distinct directions. A plurality of image sensor areas collect charge fields of the scenes focused by the plurality of lenses. Processing logic coupled with the plurality of image sensor areas processes independent digital images for each of the plurality of image sensor areas.

SUMMARY

Embodiments of the present invention that are described hereinbelow provide integrated devices for use in multispectral imaging systems.

There is therefore provided, in accordance with an embodiment of the invention, an imaging module, which includes a matrix of detector elements formed on a single semiconductor substrate and configured to output electrical signals in response to optical radiation that is incident on the detector elements. A filter layer is disposed over the detector elements and includes multiple filter zones overlying different, respective, convex regions of the matrix and having different, respective passbands.

In disclosed embodiments, the respective passbands of the filter zones include an infrared passband and at least one visible passband. The at least one visible passband may include red, green and blue passbands. Typically, the filter zones and the respective convex regions are rectangular and share a common aspect ratio. In one embodiment, the filter zones include at least first and second zones of different, respective, first and second sizes that share the common aspect ratio.

In a disclosed embodiment, the imaging module includes a plurality of sense amplifiers, which are formed on the substrate and are coupled to read out photocharge from the detector elements in respective columns of the matrix, wherein sense amplifiers that are coupled to read out the photocharge from a first one of the convex regions have a different gain from the sense amplifiers that are coupled to read out the photocharge from at least a second one of the convex regions.

In some embodiments, the module includes objective optics, which are configured to form respective images of a common field of view on all of the regions of the matrix. The filter zones may include at least first and second zones of different, respective sizes, and the objective optics may include at least first and second lenses of different, respective magnifications, which are configured to form the respective images on the respective regions of the matrix that are overlaid by at least the first and second zones. In one embodiment, the objective optics include a transparent wafer, which is etched to define focusing elements for forming the respective images, and which is overlaid on the substrate.

There is also provided, in accordance with an embodiment of the invention, an imaging module, which includes a matrix of detector elements formed on a single semiconductor substrate and configured to output electrical signals in response to optical radiation that is incident on the detector elements. Objective optics are configured to focus light onto the matrix of the detector elements so as to form respective images of a common field of view on different, respective regions of the matrix. Multiple optical filters, which have different, respective passbands, are positioned so that each filter filters the light that is focused onto a different, respective one of the regions.

In one embodiment, the objective optics include multiple lenses, which are configured to form the respective images, and the filters are formed as coatings on the lenses. Additionally or alternatively, the filters include filter layers overlaid on the matrix of the detector elements. Further additionally or alternatively, the optical filters include an interference filter, which defines a narrow passband for the light incident on one of the regions of the matrix without affecting the respective passbands of the other regions.

In an alternative embodiment, the respective passbands of the filter zones comprise a luminance passband and chrominance passbands. Additionally or alternatively, the regions of the matrix comprise at least first and second regions of different, respective sensitivities, and the objective optics comprise at least first and second lenses of different, respective F-numbers, which are configured to form the respective images on at least the first and second regions.

In some embodiments, the imaging module includes a processor, which is configured to process the electrical signals output by the detector elements in the respective regions so as to generate, based on the respective images, multispectral image data with respect to an object in the images. In a disclosed embodiment, the respective passbands of the filter zones include an infrared passband for a first region of the matrix and at least one visible passband for at least a second region of the matrix, and the processor is configured to process the image data from the first region in order to generate a three-dimensional (3D) map of the field of view, and to register the 3D map with a two-dimensional (2D) image generated by at least the second region. Additionally or alternatively, the processor is configured to apply differential deblurring to the image data from different regions of the matrix.

There is additionally provided, in accordance with an embodiment of the invention, a method for imaging, which includes providing a matrix of detector elements formed on a single semiconductor substrate and configured to output electrical signals in response to optical radiation that is incident on the detector elements. A filter layer is overlaid on the detector elements, the filter layer including multiple filter zones overlying different, respective, convex regions of the matrix and having different, respective passbands.

There is further provided, in accordance with an embodiment of the invention, a method for imaging, which includes providing a matrix of detector elements formed on a single semiconductor substrate and configured to output electrical signals in response to optical radiation that is incident on the detector elements. Objective optics are aligned to focus light onto the matrix of the detector elements so as to form respective images of a common field of view on different, respective regions of the matrix. Multiple optical filters, which have different, respective passbands, are positioned so that each filter filters the light that is focused onto a different, respective one of the regions.

There is moreover provided, in accordance with an embodiment of the present invention, an imaging module, which includes a matrix of detector elements formed on a single semiconductor substrate and configured to output electrical signals having a first dynamic range in response to optical radiation that is incident on the detector elements. Objective optics are configured to focus light onto the matrix of the detector elements so as to form respective optical images of a common field of view on different, respective regions of the matrix so that the regions sense the optical images with different, respective levels of sensitivity. A processor is configured to process the electrical signals output by the detector elements in the respective regions so as to generate a combined electronic image of the common field of view with a second dynamic range that is greater than the first dynamic range.

In one embodiment, the objective optics include lenses having different, regions F-numbers for focusing the light onto the different, respective regions, wherein the F-numbers are chosen so as to provide the different, respective levels of sensitivity.

There is furthermore provided, in accordance with an embodiment of the present invention, a method for imaging, which includes providing a matrix of detector elements formed on a single semiconductor substrate and configured to output electrical signals having a first dynamic range in response to optical radiation that is incident on the detector elements. Objective optics are aligned to focus light onto the matrix of the detector elements so as to form respective images of a common field of view on different, respective regions of the matrix so that the regions sense the optical images with different, respective levels of sensitivity. The electrical signals output by the detector elements in the respective regions are processed so as to generate a combined electronic image of the common field of view with a second dynamic range that is greater than the first dynamic range.

The present invention will be more fully understood from the following detailed description of the embodiments thereof, taken together with the drawings in which:

DETAILED DESCRIPTION OF EMBODIMENTS

Figure 1:
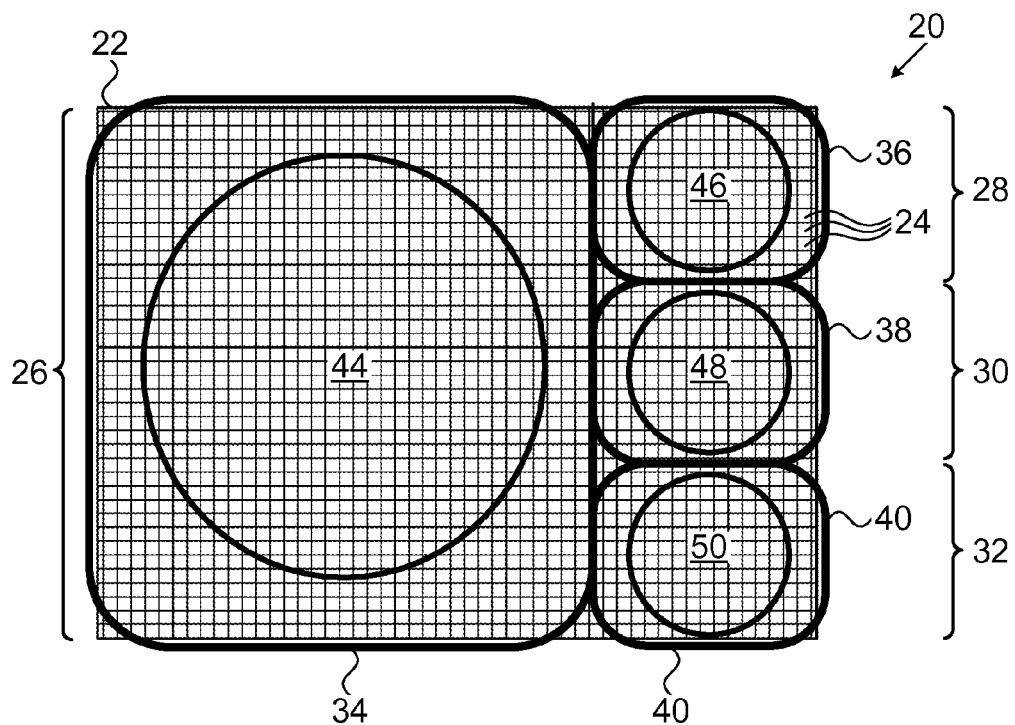
FIG. 1 is a schematic frontal view of an imaging module, in accordance with an embodiment of the present invention.

In the system described in U.S. Patent Application Publication 2010/0007717, separate color and infrared image sensors are used in generating a depth map that is registered with color image data. An embodiment of the present invention that is described hereinbelow enables both depth and color image data to be captured simultaneously by a single image sensor. More generally, embodiments of the present invention provide devices and methods that may be used to provide compact and inexpensive solutions for multispectral imaging.

In the disclosed embodiments, an imaging module comprises a matrix of detector elements, which are formed on a single semiconductor substrate and are configured to output electrical signals in response to optical radiation that is incident on the detector elements. Objective optics comprising multiple lenses focus light from a common field of view onto the matrix of the detector elements, and thus form multiple, respective images of this field of view side-by-side on different, corresponding regions of the matrix. A number of optical filters, with different, respective passbands, filter the light that is focused onto each region of the matrix.

Thus, two or more different images, each in a different spectral range, are formed simultaneously on different regions of the matrix. In the embodiments described below, the spectral ranges comprise infrared and visible light, specifically red, green and blue, but other spectral configurations may likewise be used and are considered to be within the scope of the present invention.

In some embodiments, a filter layer is disposed directly over the matrix of the detector elements. This filter layer comprises multiple filter zones overlying different, respective, convex regions of the matrix. Each filter zone has a different, respective passband, so that the corresponding region of the matrix captures an image in the spectral range defined by the passband. In the context of the present description and in the claims, the term "convex" is used in the accepted sense for describing regions in Euclidean vector space: A region is convex if for any pair of points within the region, every point on the straight line connecting the points is also in the region. In embodiments of the present invention, this criterion requires that the set of detector elements underlying each of the filter zones be convex in this sense and thus form a contiguous, closed region.

The regions of the matrix that capture the different images may be of different sizes, and the objective optics may then comprise lenses of different, respective magnifications for forming the respective images on the different regions. A processor may be coupled to process the electrical signals output by the detector elements in the respective regions so as to generate, based on the respective images, multispectral image data with respect to an object in the images. Because the images in the different spectral ranges are all formed on the same substrate, alignment and registration of the images can be easily achieved and maintained, notwithstanding the different image sizes.

Figure 2:
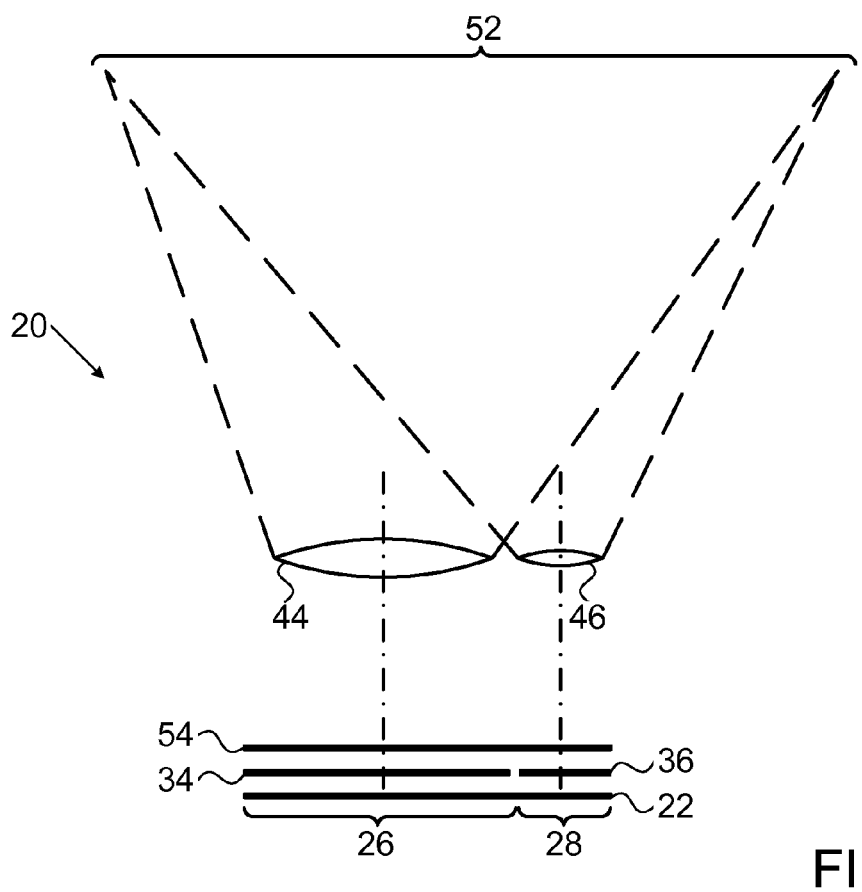
FIG. 2 is a schematic side view of the imaging module of FIG. 1.

Reference is now made to FIGS. 1 and 2, which schematically illustrate an imaging module 20, in accordance with an embodiment of the present invention. FIG. 1 is a frontal view, while FIG. 2 is a side view. Imaging module 20 comprises a single semiconductor substrate 22, such as a silicon wafer substrate, on which a matrix of detector elements 24 is formed. The detector elements and associated control and readout circuitry (not shown) may be produced using any suitable process known in the art. For example, substrate 22 and detector elements 24 may be configured as a CCD or CMOS-type image sensor. In one embodiment, module 20 is based on a commercially-available CMOS image sensor with full-HD (1920×1080) resolution, such as the OV2710 image sensor available from OmniVision (Santa Clara, Calif.).

The matrix of detector elements 24 is overlaid by a filter layer, which comprises filter zones 34, 36, 38, 40, overlying respective regions 26, 28, 30, 32 of the matrix. Each filter zone has a different passband; for example, zone 34 may pass infrared light, while zones 36, 38 and 40 pass red, green and blue light, respectively. Objective optics, comprising lenses 44, 46, 48 and 50, focus light respectively through filter zones 34, 36, 38, 40 onto regions 26, 28, 30, 32, and thus form an image on each of the regions of a common field of view 52, with each such image representing a different spectral range. In this manner, module 20 may simultaneously form infrared and color images, all of the same field of view 52. Alternatively, in other embodiments (not shown in the figures), a similar effect may be obtained by forming the filters as coatings on the corresponding lenses, or by positioning the filters at any other suitable location in the optical path.

Imaging module 20 may advantageously be used for 3D mapping and color imaging, as described in the above-mentioned U.S. Patent Application Publication 2010/0007717, for example. As noted above, module 20 has the advantage of providing both IR and color images within a single unit in fixed registration, in contrast to systems known in the art, in which active alignment and registration may be required. A pattern of IR radiation is projected onto a scene of interest, and the IR image is processed in reconstruct a 3D map of the scene.

In pattern-based 3D mapping systems, it is generally desirable to filter incoming IR radiation with a narrowband filter, which is matched to the wavelength of the pattern projector. Filter zones 34, 36, 38, 40 that are produced by coating a filter layer over the image sensor, however, typically have broad passbands. Therefore, in the embodiment that is illustrated in FIG. 1, an additional narrowband IR filter 54 is interposed in the light path. Typically, filter 54 is an interference filter, comprising thin film layers on a transparent substrate (such as glass), designed to be transparent to visible radiation while blocking IR radiation outside a narrow band containing the projection wavelength. Thus, filter 54 narrows the IR passband of module 20 without affecting the visible passbands.

The filter zones and corresponding regions of the matrix of detector elements in the present example are rectangular and may be of different sizes, as shown in FIGS. 1 and 2. In this case, the lenses will typically have different magnifications. Specifically, in the pictured example, lens 44 has a greater magnification than lenses 46, 48 and 50 and thus forms a larger image on the correspondingly larger region 26. The lenses are aligned to ensure that all will simultaneously form focused images of field of view 52 on the respective regions 26, 28, 30, 32. This alignment is typically adjusted and tested at the time of manufacture, but it may be adjusted subsequently in the field. Alternatively or additionally, other optical elements, such as mirrors and/or prisms (not shown in the figures), may be used in directing the respective images onto the different regions of the matrix of detector elements.

Despite the different sizes of regions 26, 28, 30, 32, the regions may share a common aspect ratio, meaning that the ratio of height to width is similar among the different regions. For example, using a full-HD image sensor as described above, region 26 could comprise 1280×1080 detector elements, while regions 28, 30 and 32 each comprise 640×360 detector elements. (Although the aspect ratios are not precisely the same, their similarity means that images from all the regions may be registered with relatively minor cropping of the image from region 26.) The common aspect ratio of the regions is useful when the different images are to be registered with one another. This configuration may be used, for example, to provide a high-resolution IR image (such as for 3D mapping) and a lower-resolution RGB color image, all with a 16×9 HD image format.

Other configurations of the regions and corresponding filter zones are also possible. For example, an image sensor and filters may be configured to include a larger, high-resolution luminance imaging zone (which receives the full spectrum of visible light) and smaller color-sensitive zones. This sort of sensor may be used to create color images in accordance luminance/chrominance standards, such as YUV.

Figure 3:
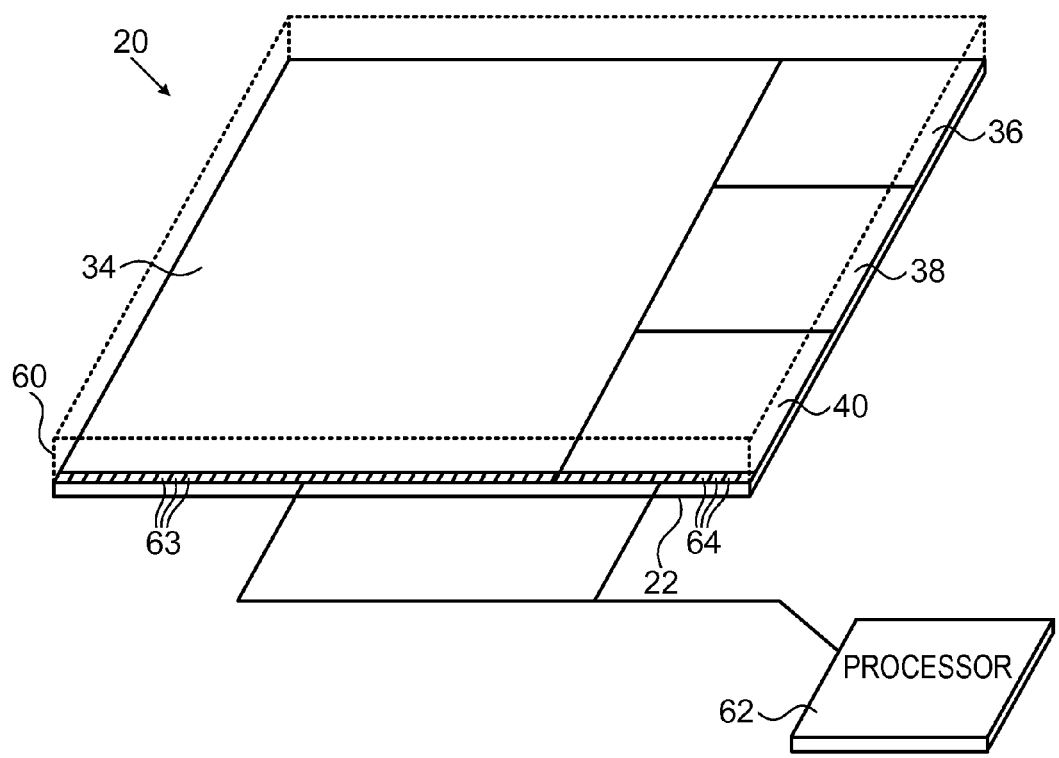
FIG. 3 is a schematic, pictorial view of an integrated imaging module, in accordance with an embodiment of the present invention.

FIG. 3 is a schematic, pictorial view of imaging module 20, in accordance with an integrated embodiment of the present invention. In this embodiment, the objective optics comprise a transparent wafer 60, which is etched to define focusing elements corresponding to lenses 44, 46, 48 and 50 for forming the respective images on the different regions of the matrix of detector elements 24 on substrate 22. Techniques for this sort of wafer-scale optical production are known in the art. One or more optical wafers of this sort (of which only one wafer is shown in the figure) may be fabricated and overlaid on substrate 22 in order to achieve the desired focusing characteristics.

The photocharge accumulated by detector elements 24 is read out through column sense amplifiers 63, 64. In the pictured embodiment, amplifiers 63 read out the columns of region 26 (overlaid by filter zone 34), while amplifiers 64 read out the columns of regions 28, 30, 32 (overlaid respectively by filter zones 36, 38, 40). Thus, the IR image signals are read out via amplifiers 63, while the RGB image signals are read out by amplifiers 64. This arrangement is advantageous, since it allows a different gain setting to be applied to the IR signal from that applied to the RGB signals. In the 3D mapping applications described above, for example, the IR image is typically faint, and amplifiers 63 may therefore be set to a higher gain than amplifiers 64. In other applications, in which region 26 receives ambient IR radiation, amplifiers 63 may be set to a lower gain.

The arrangement of amplifiers 63, 64 along the edge of the image sensor is also advantageous in that it does not depart from the layout of image sensor chips that are known in the art (other than having different, possibly adjustable gain controls for the different amplifiers). Alternatively, further sense amplifiers and readout lines may be provided on substrate 22 to enable independent gain settings for zones 28, 30 and 32, as well.

Additionally or alternatively, the relative F-numbers of lenses 44, 46, 48 and 50 may be chosen so that the amount of light focused onto each of regions 26, 28, 30, 32 is adjusted to compensate for the different sensitivities of the regions. In other words, more light may be focused onto the less sensitive regions, and less light onto the more sensitive regions, thus enhancing the overall dynamic range of the imaging module.

As yet another alternative imaging module 20 may be used to implement high dynamic range imaging, by dividing the image sensor into more sensitive and less sensitive regions.

The variation in the respective levels of sensitivity may be achieved by appropriate choice of the corresponding lens F-numbers. The more sensitive region will capture details in the low-light parts of the image, while the less sensitive region will simultaneously capture high-light parts. A processor combines the simultaneously-acquired image information from both regions to create a single image with a dynamic range that is higher than the dynamic range of the electrical signals that are output by the detector elements of the image sensor.

A processor 62 receives the electrical signals that are output by detector elements 24 on substrate 22. Although FIG. 3, for the sake of conceptual clarity, shows separate connections between processor 62 and the different regions of the image sensor, in practice the signals from all of the detector elements in the different regions may be read out through common output circuits to the processor, which then uses timing information to separate out the corresponding images. Furthermore, although the processor is shown in the figure as a separate unit from the image sensor, the processor may alternatively be formed on substrate 22 alongside the matrix of detector elements.

Processor 62 typically registers the images formed on regions 26, 28, 30 and 32 to generate multispectral image data with respect to objects in field of view 52. For example, processor 62 may use an infrared image, captured in region 26, of a pattern that is projected onto objects in the field of view in order to produce a 3D map of the objects, and may integrate the 3D map with a color image of the objects captured by regions 28, 30 and 32. Suitable circuits and techniques for this purpose are described in the above-mentioned U.S. Patent Application Publication 2010/0007717. Alternatively or additionally, processor 62 may carry out other sorts of image processing operations, as are known in the art.

As noted earlier, lenses 44, 46, 48 and 50 are designed to have the same back focal length, but it may happen due to production tolerances that after module 20 is assembled, some of these lenses will be better focused than others. The defocus may be measured, for example, by capturing an image of a suitable resolution target. Processor 62 may then be programmed to compensate for the focal quality differences by applying a deblurring algorithm to the images, with differential deblurring for the different regions. Algorithms that are known in the art may be used, mutatis mutandis, for this purpose. For example, in one embodiment, processor 62 applies the Lurry-Richardson algorithm, as described by Richardson in an article entitled "Bayesian-Based Iterative Method of Image Restoration," *Journal of the Optical Society of America* 62:1, pages 55-59 (1972), which is incorporated herein by reference.

Figure 4:
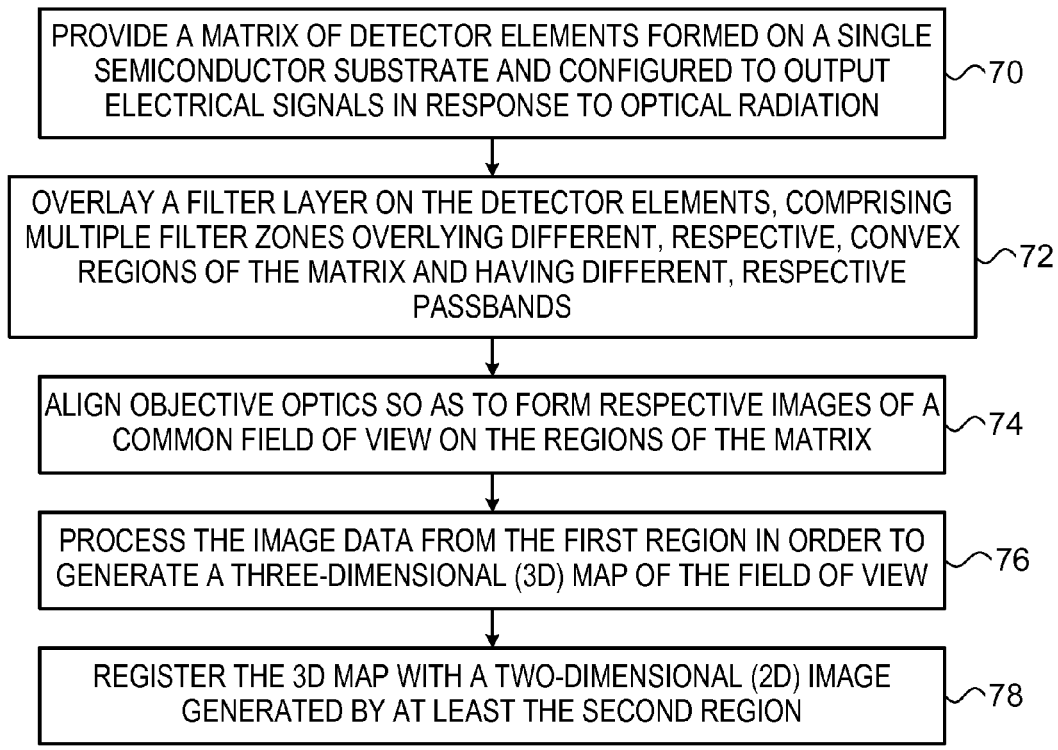
FIGS. 4 and 5 are flow charts that schematically illustrate methods for imaging, in accordance with embodiments of the present invention.

FIG. 4 is a flow chart that schematically illustrates a method for imaging, in accordance with an embodiment of the present invention. At step 70, a matrix of detector elements is formed on a single semiconductor substrate and configured to output electrical signals in response to optical radiation that is incident on the detector elements. At step 72, a filter layer is overlaid on the detector elements, comprising multiple filter zones overlying different, respective, convex regions of the matrix and having different, respective passbands. The filter zones define filters, such that each filter filters the light that is focused onto a different, respective one of the regions. At step 74, objective optics are aligned to focus light onto the matrix of the detector elements so as to form respective images of a common field of view on different, respective regions of the matrix. Optionally, at step 76, image data from a first region are processed in order to generate a 3D map of the field of view. At step 78, the 3D map is registered with a 2D image generated by at least a second region.

Figure 5:
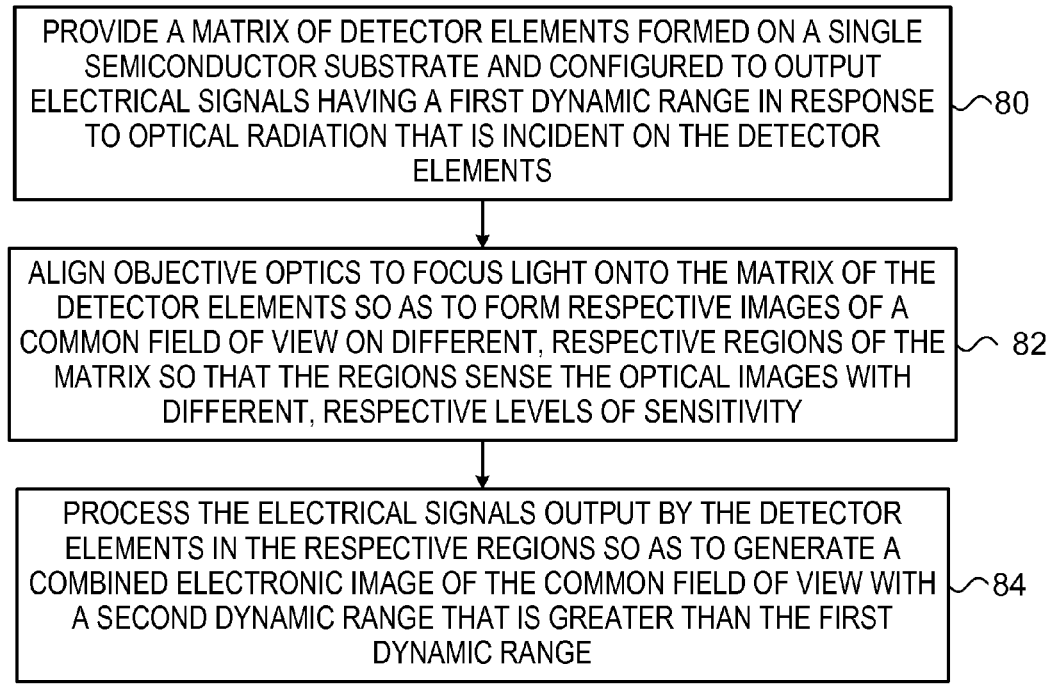

FIG. 5 is a flow chart that schematically illustrates a method for imaging, in accordance with another embodiment of the present invention. At step 80, a matrix of detector elements is formed on a single semiconductor substrate and configured to output electrical signals having a first dynamic range in response to optical radiation that is incident on the detector elements. At step 82, objective optics are aligned to focus light onto the matrix of the detector elements so as to form respective regions of the matrix so that the regions sense the optical images with different, respective levels of sensitivity. At step 84, the electrical signals output by the detector elements in the respective regions are processed so as to generate a combined electronic image of the common field of view with a second dynamic range that is greater than the first dynamic range.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An imaging module, comprising:
   a matrix of detector elements formed on a single semiconductor substrate and configured to output electrical signals in response to optical radiation that is incident on the detector elements; and
   a filter layer, which is disposed over the detector elements and comprises multiple filter zones overlying different, respective, convex rectangular regions of the matrix and having different, respective passbands, each of the rectangular regions comprising multiple rows and columns of the detector elements,
   wherein the filter zones and the respective convex regions share a common aspect ratio, while the filter zones comprise at least first and second zones of different, respective, first and second sizes that share the common aspect ratio.

2. The imaging module according to claim 1, wherein the respective passbands of the filter zones comprise an infrared passband and at least one visible passband.

3. The imaging module according to claim 2, wherein the at least one visible passband comprises red, green and blue passbands.

4. The imaging module according to claim 1, wherein the imaging module comprises a plurality of sense amplifiers, which are formed on the substrate and are coupled to read out photocharge from the detector elements in respective columns of the matrix,
   wherein the sense amplifiers that are coupled to read out the photocharge from a first one of the convex regions have a different gain from the sense amplifiers that are coupled to read out the photocharge from at least a second one of the convex regions.

5. The imaging module according to claim 1, and comprising objective optics, which are configured to form respective images of a common field of view on all of the regions of the matrix.

6. The imaging module according to claim 5, wherein the filter zones comprise at least first and second zones of different, respective sizes, and wherein the objective optics comprise at least first and second lenses of different, respective magnifications, which are configured to form the respective images on the respective regions of the matrix that are overlaid by at least the first and second zones.

7. The imaging module according to claim 5, wherein the objective optics comprise a transparent wafer, which is etched to define focusing elements for forming the respective images, and which is overlaid on the substrate.

8. The imaging module according to claim 5, and comprising a processor, which is configured to process the electrical signals output by the detector elements in the respective regions so as to generate, based on the respective images, multispectral image data with respect to an object in the images.

9. An imaging module, comprising:
   a matrix of detector elements formed on a single semiconductor substrate and configured to output electrical signals in response to optical radiation that is incident on the detector elements;
   objective optics, which are configured to focus light onto the matrix of the detector elements so as to form respective images of a common field of view on different, respective regions of the matrix,
   wherein the regions of the matrix comprise at least first and second regions of different, respective sizes, and wherein the objective optics comprise at least first and second lenses of different, respective magnifications, which are configured to form the respective images on at least the first and second regions; and
   multiple optical filters, which have different, respective passbands and are positioned so that each filter filters the light that is focused onto a different, respective one of the regions.

10. The imaging module according to claim 9, wherein the objective optics comprise multiple lenses, which are configured to form the respective images, and wherein the filters are formed as coatings on the lenses.

11. The imaging module according to claim 9, wherein the filters comprise filter layers overlaid on the matrix of the detector elements.

12. The imaging module according to claim 11, wherein the optical filters further comprise an interference filter, which defines a narrow passband for the light incident on one of the regions of the matrix without affecting the respective passbands of the other regions.

13. The imaging module according to claim 9, wherein the respective passbands of the filter zones comprise an infrared passband and at least one visible passband.

14. The imaging module according to claim 13, wherein the at least one visible passband comprises red, green and blue passbands.

15. The imaging module according to claim 9, wherein the respective passbands of the filter zones comprise a luminance passband and chrominance passbands.

16. The imaging module according to claim 9, wherein the regions of the matrix comprise at least first and second regions of different, respective sensitivities, and wherein the objective optics comprise at least first and second lenses of different, respective F-numbers, which are configured to form the respective images on at least the first and second regions.

17. The imaging module according to claim 9, wherein the objective optics comprise a transparent wafer, which is etched to define a plurality of lenses, and which is overlaid on the substrate.

18. The imaging module according to claim 9, and comprising a processor, which is configured to process the electrical signals output by the detector elements in the respective regions so as to generate, based on the respective images, multispectral image data with respect to an object in the images.

19. The imaging module according to claim 18, wherein the respective passbands of the filter zones comprise an infrared passband for a first region of the matrix and at least one visible passband for at least a second region of the matrix, and
   wherein the processor is configured to process the image data from the first region in order to generate a three-dimensional (3D) map of the field of view, and to register the 3D map with a two-dimensional (2D) image generated by at least the second region.

20. The imaging module according to claim 18, wherein the processor is configured to apply differential deblurring to the image data from different regions of the matrix.

21. A method for imaging, comprising:
   providing a matrix of detector elements formed on a single semiconductor substrate and configured to output electrical signals in response to optical radiation that is incident on the detector elements; and
   overlaying a filter layer on the detector elements, the filter layer comprising multiple filter zones overlying different, respective, convex rectangular regions of the matrix and having different, respective passbands, each of the rectangular regions comprising multiple rows and columns of the detector elements,
   wherein the filter zones and the respective convex regions share a common aspect ratio, while the filter zones comprise at least first and second zones of different, respective, first and second sizes that share the common aspect ratio.

22. The method according to claim 21, and comprising aligning objective optics so as to form respective images of a common field of view on all of the regions of the matrix.

23. A method for imaging, comprising:
   providing a matrix of detector elements formed on a single semiconductor substrate and configured to output electrical signals in response to optical radiation that is incident on the detector elements;
   aligning objective optics to focus light onto the matrix of the detector elements so as to form respective images of a common field of view on different, respective regions of the matrix,
   wherein the regions of the matrix comprise at least first and second regions of different, respective sizes, and wherein aligning the objective optics comprise providing at least first and second lenses of different, respective magnifications so as to form the respective images on at least the first and second regions; and
   positioning multiple optical filters, which have different, respective passbands, so that each filter filters the light that is focused onto a different, respective one of the regions.

24. The method according to claim 23, wherein the respective passbands of the filter zones comprise an infrared passband for a first region of the matrix and at least one visible passband for at least a second region of the matrix, and
   wherein the method comprises processing the image data from the first region in order to generate a three-dimensional (3D) map of the field of view, and registering the 3D map with a two-dimensional (2D) image generated by at least the second region.

25. An imaging module, comprising:
   a matrix of detector elements formed on a single semiconductor substrate and configured to output electrical signals having a first dynamic range in response to optical radiation that is incident on the detector elements;

objective optics, which are configured to focus light onto the matrix of the detector elements so as to form respective optical images of a common field of view on different, respective regions of the matrix so that the regions sense the optical images with different, respective levels of sensitivity, wherein the objective optics comprise lenses having different, respective F-numbers for focusing the light onto the different, respective regions, wherein the F-numbers are chosen so as to provide the different, respective levels of sensitivity; and a processor, which is configured to process the electrical signals output by the detector elements in the respective regions so as to generate a combined electronic image of the common field of view with a second dynamic range that is greater than the first dynamic range.

26. A method for imaging, comprising:

providing a matrix of detector elements formed on a single semiconductor substrate and configured to output electrical signals having a first dynamic range in response to optical radiation that is incident on the detector elements;

aligning objective optics to focus light onto the matrix of the detector elements so as to form respective images of a common field of view on different, respective regions of the matrix so that the regions sense the optical images with different, respective levels of sensitivity, wherein the objective optics comprise lenses having different, respective F-numbers for focusing the light onto the different, respective regions, wherein the F-numbers are chosen so as to provide the different, respective levels of sensitivity; and processing the electrical signals output by the detector elements in the respective regions so as to generate a combined electronic image of the common field of view with a second dynamic range that is greater than the first dynamic range.

* * * * *